(12) United States Patent
Cohen et al.

(10) Patent No.: US 8,106,808 B1
(45) Date of Patent: Jan. 31, 2012

(54) SUCCESSIVE TIME-TO-DIGITAL CONVERTER FOR A DIGITAL PHASE-LOCKED LOOP

(75) Inventors: Hanan Cohen, San Diego, CA (US); Simon Pang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 54 days.

(21) Appl. No.: 12/841,131

(22) Filed: Jul. 21, 2010

(51) Int. Cl.
*H03M 1/50* (2006.01)
(52) U.S. Cl. ........................................ 341/166; 341/155
(58) Field of Classification Search .................. 341/155, 341/166
See application file for complete search history.

(56) References Cited

U.S. PATENT DOCUMENTS 7,332,973 B2 * 2/2008 Lee et al. ......................... 331/25
7,746,256 B2 * 6/2010 Wiesbauer et al. ........... 341/143
7,884,751 B2 * 2/2011 Shimizu et al. ............... 341/166

OTHER PUBLICATIONS

Roberts, G.W.; Ali-Bakhshian, M.; , "A Brief Introduction to Time-to-Digital and Digital-to-Time Converters," Circuits and Systems II: Express Briefs, IEEE Transactions on Mar. 2010; pp. 153-157.

* cited by examiner

*Primary Examiner* — Khai M Nguyen
(74) *Attorney, Agent, or Firm* — Law Office of Gerald Maliszewski; Gerald Maliszewski (57) ABSTRACT

A successive time-to-digital converter (STDC) method is provided for supplying a digital word representing the ratio between a phase-locked loop PLL frequency synthesizer signal and a reference clock. The number of frequency synthesizer clock cycles per reference clock cycle is counted. A first difference is measured between a reference clock period and a corresponding frequency synthesizer clock period. In response to the first measurement, a second difference is measured between a delayed reference clock period and the corresponding frequency synthesizer clock period, where the second difference is less than the first difference. A third difference is measured as a time duration between the delayed reference clock period and the corresponding delayed frequency synthesizer clock period. The first and third difference measurements and the count of the number of frequency synthesizer clock cycles per reference clock cycle are used to calculate a digital error signal supplied to the frequency synthesizer.

18 Claims, 10 Drawing Sheets

SUCCESSIVE TIME-TO-DIGITAL CONVERTER FOR A DIGITAL PHASE-LOCKED LOOP

BACKGROUND OF THE INVENTION

1. Field of the Invention

This invention generally relates to digital communications and, more particularly, to a system and method using time-to-digital converters (TDCs) for generating digital phase-locked loop (PLL) error signals.

2. Description of the Related Art

Digital PLLs (DPLLs) are an area of active research and development. A DPLL performs the loop filtering function in the digital domain with synthesized logic. DPLLs provide several advantages over the analog PLLs, including easier and faster implementation, and better controllability of the PLL parameters. Also, the integrated circuit (IC) die area devoted to the circuitry and power consumption can be greatly reduced, especially in advanced fabrication processes. Therefore, there is a growing interest in DPLLs for high performance applications.

In a PLL based frequency synthesizer, the voltage controlled oscillator (VCO) clock is constantly compared with a reference clock. This comparison generates an error signal that is filtered and provided to the VCO, to correct the VCO frequency. In a charge pump PLL (CPPLL), a combination of phase/frequency detector (PFD) and charge pump perform phase error detection, and output an analog error signal. In DPLL, there is a need to convert this analog error signal to a digital error signal. One way of converting an analog signal to a digital signal is to utilize an analog-to-digital converter (A/D), but this approach requires additional power consumption and IC die area. A more practical approach would be to use a TDC to directly convert the phase offset to a digital error signal. A TDC can be used to digitize the duration of time between two events, usually represented by the edges of a signal. As described in more detail below, a TDC can be enabled with a delay line and sampling flip flops.

A key implementation challenge with the use of a TDC is the achievement a fine resolution error signal, in order to minimize the quantization noise effect on the PLL closed loop performance. However, a very fine resolution TDC usually has high, power consumption, making it unattractive compared to conventional charge pump architecture. Therefore, a major challenge associated with a TDC is the tradeoff between resolution and power consumption. For example, a 155 megahertz (MHz) reference clock and 5 picoseconds (ps) of resolution require more than $2^{10}$ delay elements/samplers. It would be advantageous if a low-power TDC architecture could be used in DPLLs.

It would be advantageous if TDC power consumption could be minimized by significantly reducing the dynamic range requirements over which the TDC is expected to operate.

SUMMARY OF THE INVENTION

Disclosed herein are a system and method for using a Time-to-Digital Converter (TDC) to replace a conventional Phase Frequency Detector (PFD)/charge-pump (CP) in an analog Phase Lock Loop (PLL) system. The TDC compares a reference clock to a frequency synthesizer feedback clock, and generates a digital word that represents the phase offset between the two. This Successive Time to Digital Converter (STDC) processes the reference clock and frequency synthesizer clock, and generates a digital word representing the ratio of the two clock cycles, from which a digital representation of phase offset can be derived. The STDC is able to achieve comparable resolution to a conventional TDC with almost an order of magnitude fewer delay element/samplers. Furthermore, the STDC allows dynamic power management, which significantly reduces the power consumption. By improving the performance-to-power dissipation ratio of TDCs, the building of power efficient high performance digital PLLs is possible. Another advantage is that the PLL can be made without the need for a divider in the feedback loop.

Accordingly, a successive time-to-digital converter (STDC) method is provided for supplying a digital word representing the ratio between a phase-locked loop PLL frequency synthesizer signal and a reference clock. The method accepts a reference clock and a frequency synthesizer signal. The number of frequency synthesizer clock cycles per reference clock cycle is counted. A first difference is measured between an edge of a reference clock period and a corresponding edge of a frequency synthesizer clock period. In response to the first measurement, a second difference is measured between an edge of a delayed reference clock period and the corresponding edge of the frequency synthesizer clock period, where the second difference is less than the first difference. A third difference is measured as a time duration between the edge of the delayed reference clock period and the corresponding edge of a frequency synthesizer clock period delayed a full period. The third difference measurement, the first difference measurement, and the count of the number of frequency synthesizer clock cycles per reference clock cycle, are used to calculate a digital error signal, which is supplied to the frequency synthesizer.

Additional details of the above-described method and STDC system are presented below.

DETAILED DESCRIPTION

Figure 1:
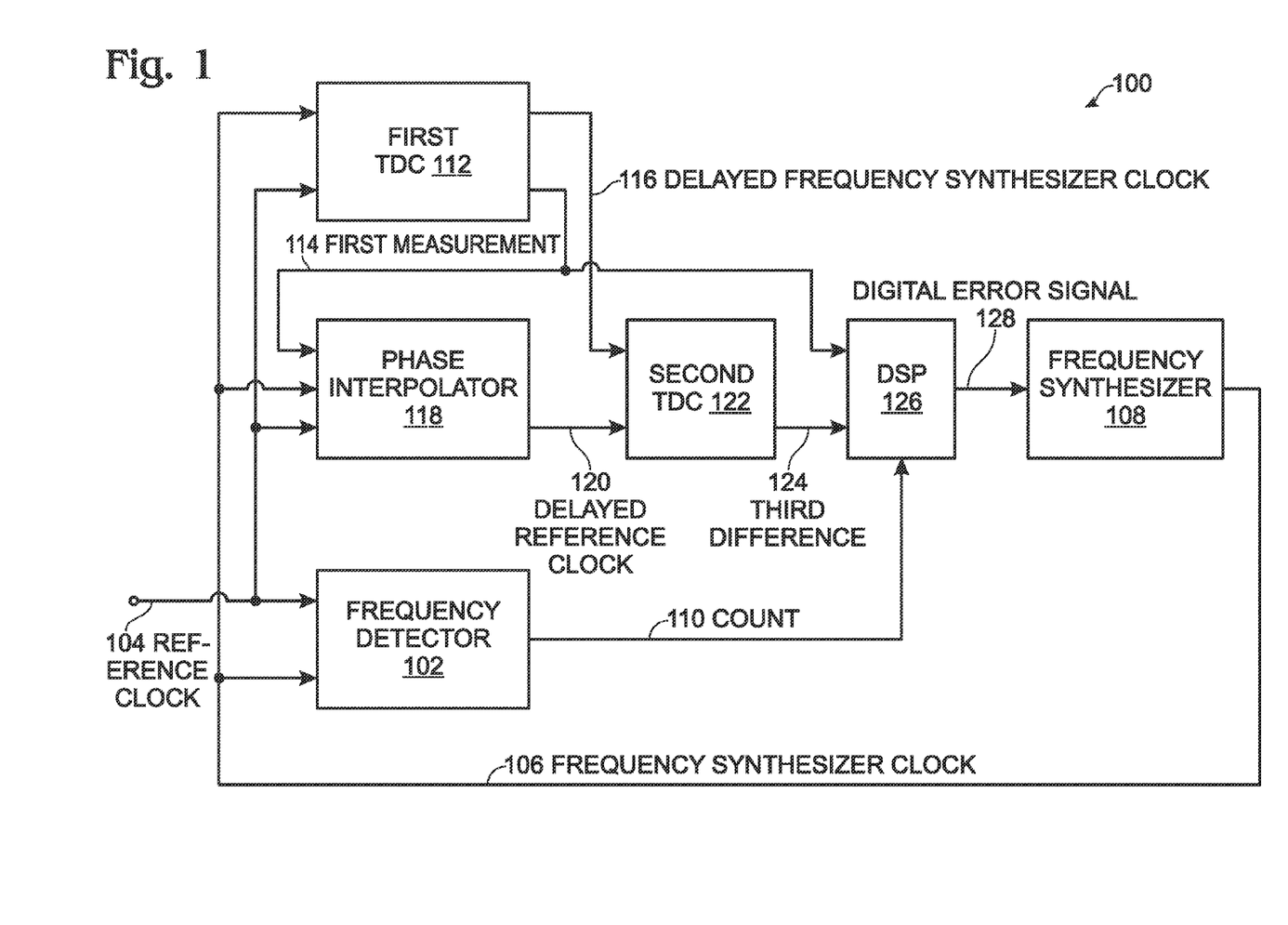
FIG. 1 is a schematic block diagram of a successive time-to-digital converter (STDC) and frequency synthesizer.

FIG. 1 is a schematic block diagram of a successive time-to-digital converter (STDC) and frequency synthesizer. The STDC 100 comprises a frequency detector 102 having an input on line 104 to accept a reference clock (REFCLK), and an input on line 106 to accept a frequency synthesizer clock (VCOCLK) from a frequency synthesizer 108. The frequency detector 102 has an output on line 110 to supply a count of the number of frequency synthesizer clock cycles per reference clock cycle (HSCNTROUT), also referred to as the count. A first TDC 112 has an input on line 104 to accept the reference clock, and an input on line 106 to accept the frequency synthesizer clock. The first TDC 112 measures a first difference between an edge of a reference clock period and a corresponding edge of a frequency synthesizer clock period, and provides the first difference measurement (CTDCOUT) at an output on line 114. The first TDC 112 also provides the frequency synthesizer clock delayed a full cycle (VCOCLK+ 2π) on line 116.

A phase interpolator 118 has an input on line 104 to accept the reference clock, an input on line 106 to accept the frequency synthesizer clock, and an input on line 114 to accept the first difference measurement. The phase interpolator 118 supplies the reference clock on line 120 delayed to create a second difference (REFCLK+Φx) between the edge of the delayed reference clock period and the corresponding edge of the frequency synthesizer clock period, where the second difference is less than the first difference.

A second TDC 122 has an input on line 120 to accept the delayed reference clock period, and input on line 116 to accept the delayed frequency synthesizer clock. The second TDC 122 measures a third difference (FTDCOUT) between the edge of the delayed reference clock period and the corresponding edge of the delayed frequency synthesizer clock period, and provides the third difference measurement as a time duration on line 124. A digital signal processor (DSP) 126 has an input on line 124 to accept the third difference measurement, an input on line 114 to accept the first difference measurement, and an input on line 110 to accept the count from the frequency detector. The DSP 126 has an output on line 128 to supply a digital error signal to the frequency synthesizer 108. The digital error signal to the frequency synthesizer 108 may frequency error signal, a phase error signal, or both a phase and frequency error signal (in succession). Advantageously, the digital error signal can be supplied directly to a, digital frequency synthesizer.

Figure 2:
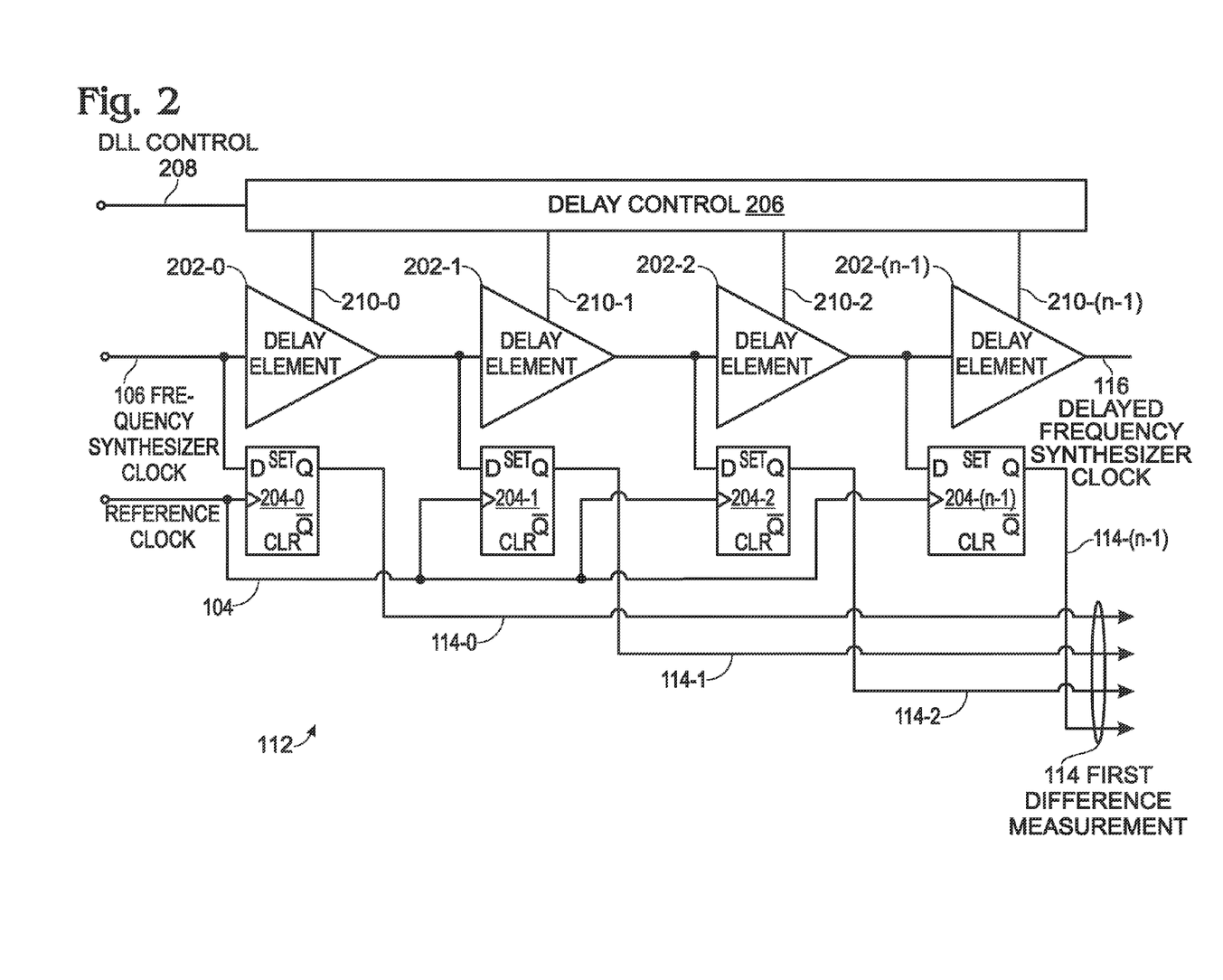
FIG. 2 is a schematic block diagram depicting a detailed example of the first TDC of FIG. 1.

FIG. 2 is a schematic block diagram depicting a detailed example of the first TDC of FIG. 1. In one aspect, the first TDC 112 supplies the first difference measurement as a digital word representing the relationship between the edge of the reference clock and a phase of the frequency synthesizer clock. As shown in this example, the first TDC 112 includes n serially connected delay circuits 202-0 through 202-(n−1) accepting the frequency synthesizer clock on line 106, and supplying n frequency synthesizer clock phases on line 106 (no delay), 200-0, 200-1, and 200-(n−1). In this example, n=4, but the TDC is not limited to any particular value. Also shown are n latches 204-0 through 204-(n−1). Each latch 204 has a signal input connected to receive a corresponding frequency synthesizer clock phase. Each latch 204 also has a clock input connected to receive the reference clock on line 104, and an output on line 114 to supply a corresponding bit in an n-bit first difference measurement signal.

Also shown is a delay control element 206 accepting a DLL control signal on line 208 from the DSP (not shown in FIG. 1). The delay control element 206 is able to control the delay through delay elements 202 with signals on lines 210-0 through 210-(n−1), in response to the DLL control signal. As used herein, delay coverage is the maximum period of time that a TDC can process. The time period beyond the delay coverage cannot be distinguished by the TDC. Typically, the delay coverage is the total delay of the delay chain. Resolution is the TDC step size as a time duration measurement, and dynamic range is the ratio of delay coverage to resolution. These variables may be set with the DLL control signal.

It should be noted that a number of TDC designs are known in the art, and that the first TDC of FIG. 1 can be enabled using designs other than the example depicted in FIG. 2.

Figure 3:
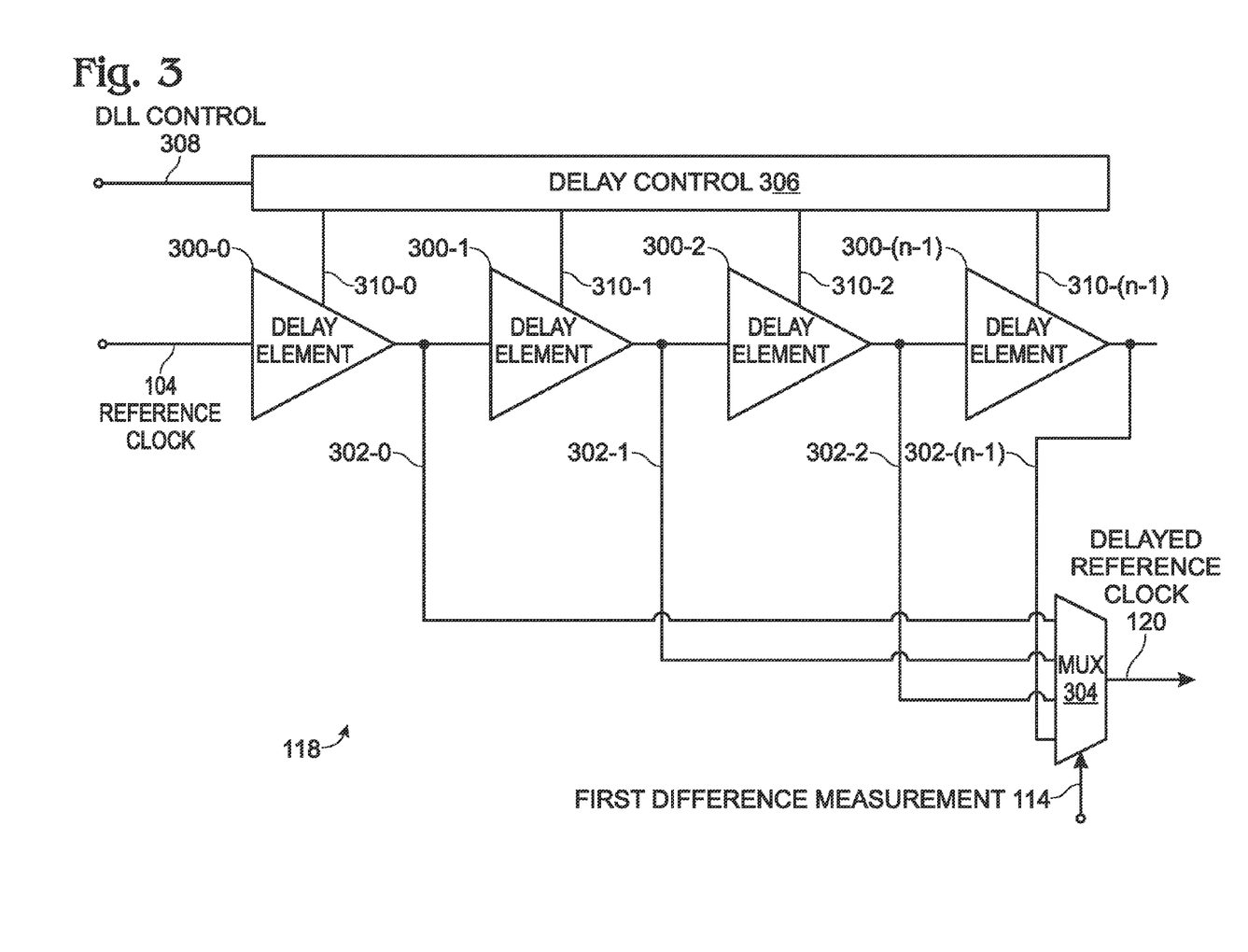
FIG. 3 is a schematic block diagram depicting a detailed example of the phase interpolator of FIG. 1.

FIG. 3 is a schematic block diagram depicting a detailed example of the phase interpolator of FIG. 1. As shown, n serially connected delay circuits 300-0 through 300-(n−1) accept the reference clock on line 104, and supply n reference clock phases on 302-0, 302-1, 302-2, and 302-(n−1). In this example n=4, but the phase interpolator is not limited to any particular value. A multiplexer (MUX) 304 has signal inputs on line 302-0, 302-1, 302-2, and 302-(n−1) to accept them reference clock phases and a control input on line 114 to accept the first difference measurement.

Also shown is a delay control element 306 accepting a DLL control signal on line 308 from the DSP (not shown in FIG. 1). The delay control element 306 is able to control the delay through delay elements 300 with signals on lines 310-0 through 310-(n−1), in response to the DLL control signal. It should be noted that a number of TDC designs are known in the art, and that the phase interpolator of FIG. 1 can be enabled using designs other than the example depicted in FIG. 3.

Figure 4:
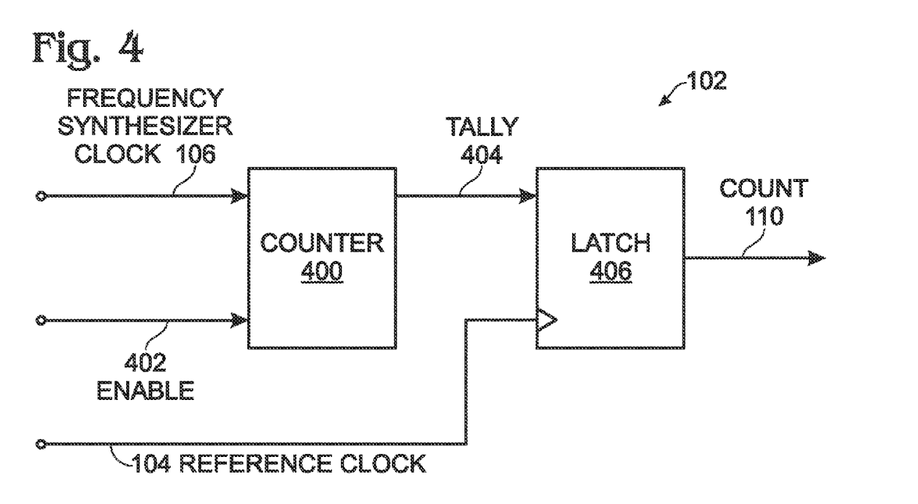
FIG. 4 is a schematic block diagram depicting an example of the frequency detector of FIG. 1 is greater detail.

FIG. 4 is a schematic block diagram depicting an example of the frequency detector of FIG. 1 is greater detail. In this example, the frequency detector 102 includes a counter 400 having an input to accept the frequency synthesizer clock on line 106, an input to accept an enable signal from the DSP on-line 402, and an output to supply a tally (COUNTVAL) on line 404, triggered by the enable signal. A latch 406 has a signal input to accept the tally on line 404, and clock input, connected to receive the reference clock on line 104, and an output to supply the count of the number of frequency synthesizer clock cycles per reference clock cycle on line 110. Other means of sampling the number of frequency synthesizer clock cycles per reference clock cycle are known in the art that would enable the frequency counter of FIG. 1.

Figure 5:
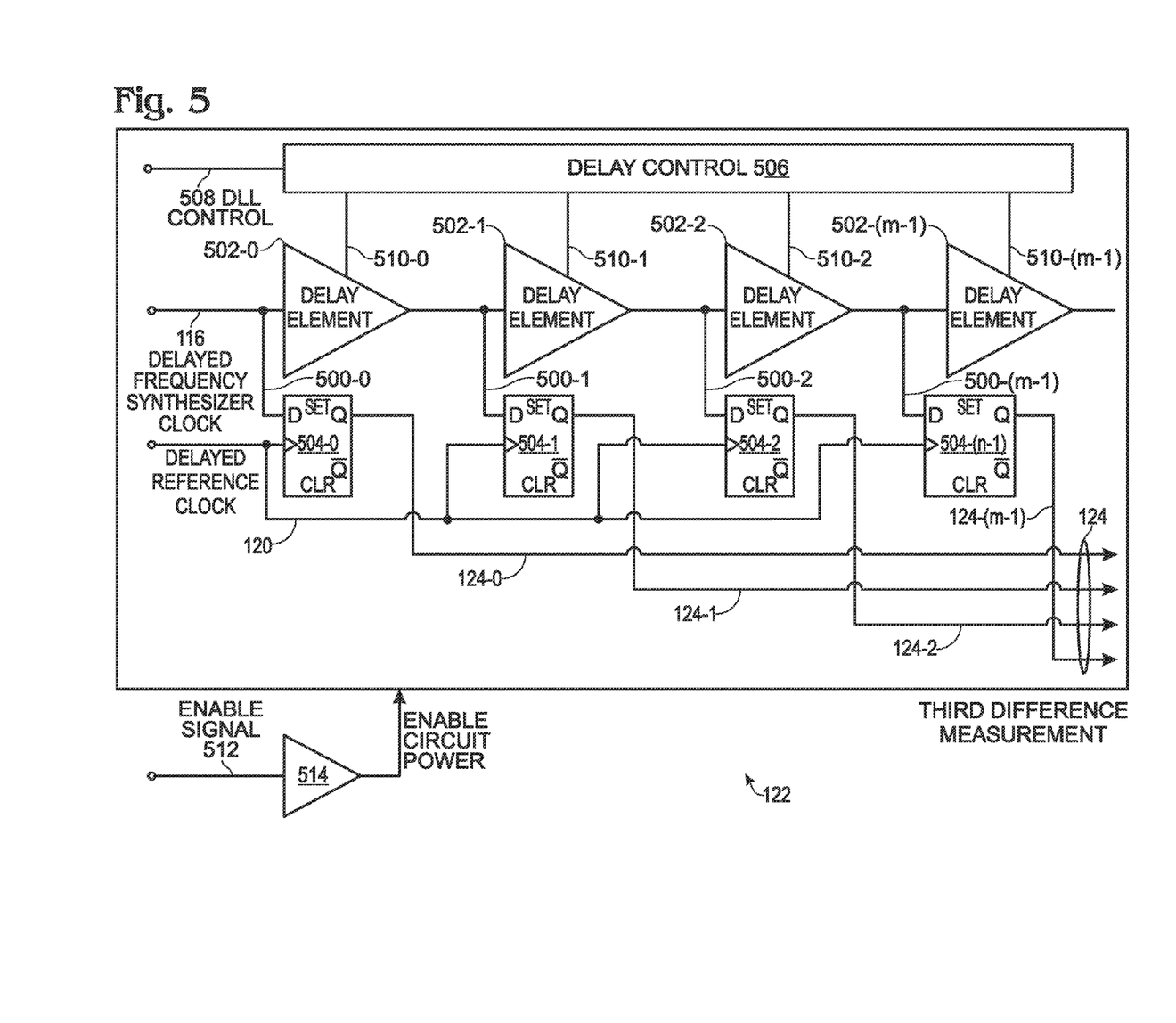
FIG. 5 is a schematic block diagram depicting a detailed example of the second TDC of FIG. 1.

FIG. 5 is a schematic block diagram depicting a detailed example of the second TDC of FIG. 1. In one aspect, the second TDC 122 supplies the third difference measurement as a digital word on line 124, representing the relationship between the edge of the delayed reference clock and a phase of the delayed frequency synthesizer clock. As shown in this example, the second TDC 122 includes m serially connected delay circuits 502-0 through 502-(m−1) to accept the delayed frequency synthesizer clock on line 116, and supplying m phases of the delayed frequency synthesizer clock on line 116 (500-0), 500-1, 500-2, and 500-(m−1). In this example, m=4, but the TDC is not limited to any particular value. Neither is there any particular relationship between the value of m and the value of n. Also shown are m latches 504-0 through 504-(m−1). Each latch 504 has a signal input connected to receive a corresponding phase of the delayed frequency synthesizer clock. Each latch 504 also has a clock input connected to receive the delayed reference clock on line 120, and an output on line 124 to supply a corresponding bit in an m-bit third difference measurement signal.

Also shown is a delay control element 506 accepting a DLL control signal on line 508 from the DSP (not shown in FIG. 1). The delay control element 506 is able to control the delay through delay elements 502 with signals on lines 510-0 through 510-(m−1), in response to the DLL control signal. It should be noted that a number of TDC designs are known in the art, and that the second TDC of FIG. 1 can be enabled using designs other than the example depicted in FIG. 5.

In another aspect, the second TDC 120 is selectively enabled in response to a signal from the DSP on line 512. As shown, device 514 supplies power to the second TDC 120 on line 516 in response to the enable signal on line 512.

Functional Description

Figure 6:
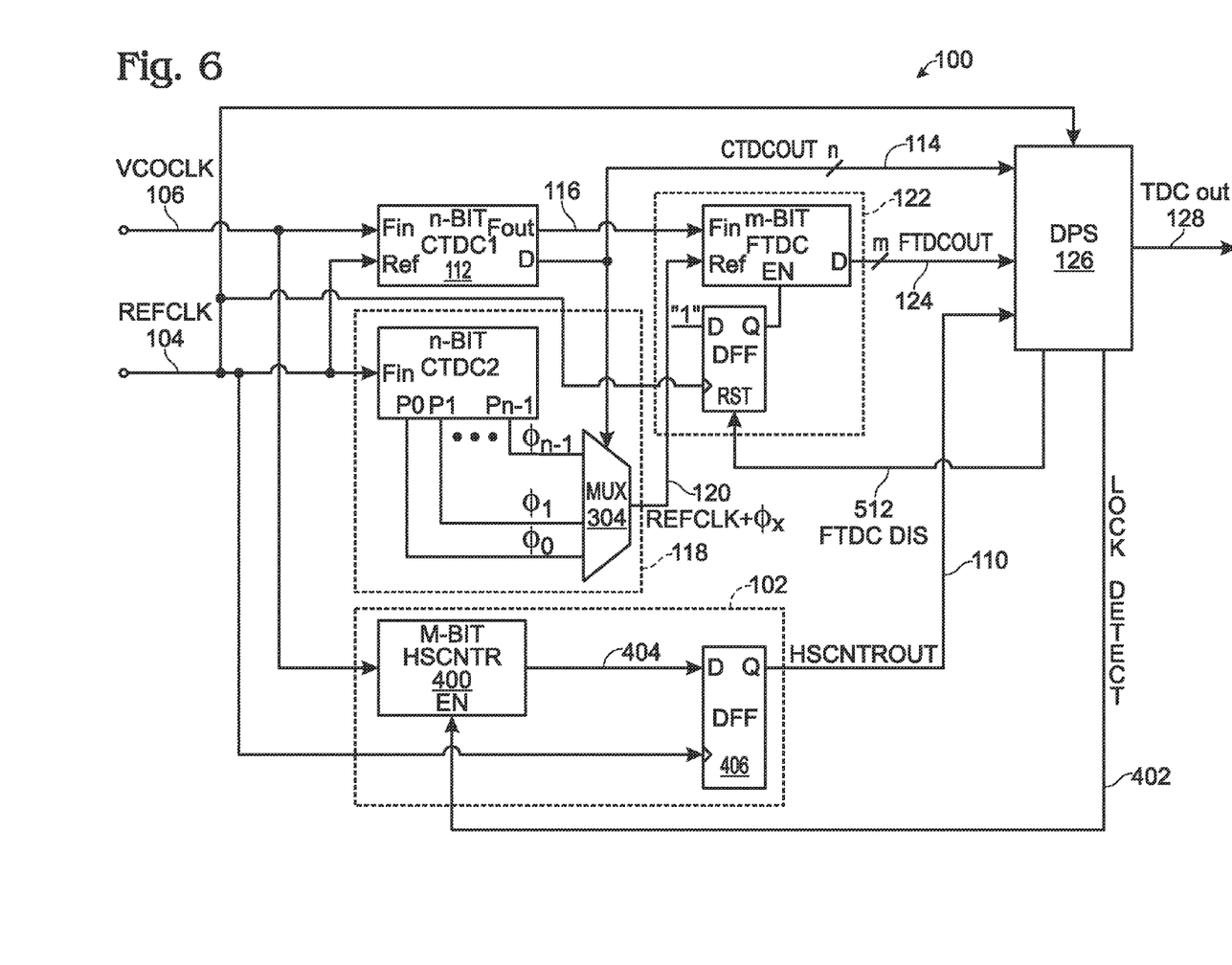
FIG. 6 is a schematic block diagram depicting the overall STDC of FIG. 1 in greater detail.

FIG. 6 is a schematic block diagram depicting the overall STDC of FIG. 1 in greater detail. As shown, the STDC 100 includes two coarse TDCs (CTDCs) 112 and 118, a fine resolution TDC (FTDC) 122, and a high speed counter (HSCNTR) or frequency detector 102. CTDC 118 performs the function of a phase interpolator. The HSCNTR 102 is a counter that increments at every rising edge of the frequency synthesizer clock (VCOCLK). HSCNTR cycles every $2^{k\,vcoclk}$ cycles, where k≥max($\log_2(T_{ref}/t_{vcoclk})$) to ensure correct operation.

Both the first TDC 112 and the phase interpolator 118 are calibrated to have a total delay coverage of one frequency synthesizer clock cycle. CTDC1 112 measures the relative position of the reference clock (REFCLK). With n delay stages, the output of CTDC1 on line 114 is accurate to 1/n clock cycles. The VCOCLK+2π (delayed frequency synthesizer clock) on line 116 is the frequency synthesizer clock, on line 106, delayed by 1 frequency synthesizer clock cycle. CTDCOUT on line 114 (first difference measurement) is a digital word that represents the delay difference between the rising edge of the REFCLK and the rising edge of the frequency synthesizer clock (VCOCLK).

CTDC2 118 produces n phases of REFCLK, $\Phi_0, \Phi_1 \ldots$ and $\Phi_{n-1}$, which are 1/n frequency synthesizer clock cycles apart. The FTDC 120 is a TDC calibrated to have delay coverage of 1/n frequency synthesizer clock (VCOCLK) cycles and it outputs n bits that represent the position of the rising edge of the delayed REFCLK (REFCLK+Φx) with respect to the rising edge of the delayed frequency synthesizer clock (VCOCLK+2π).

Figure 7:
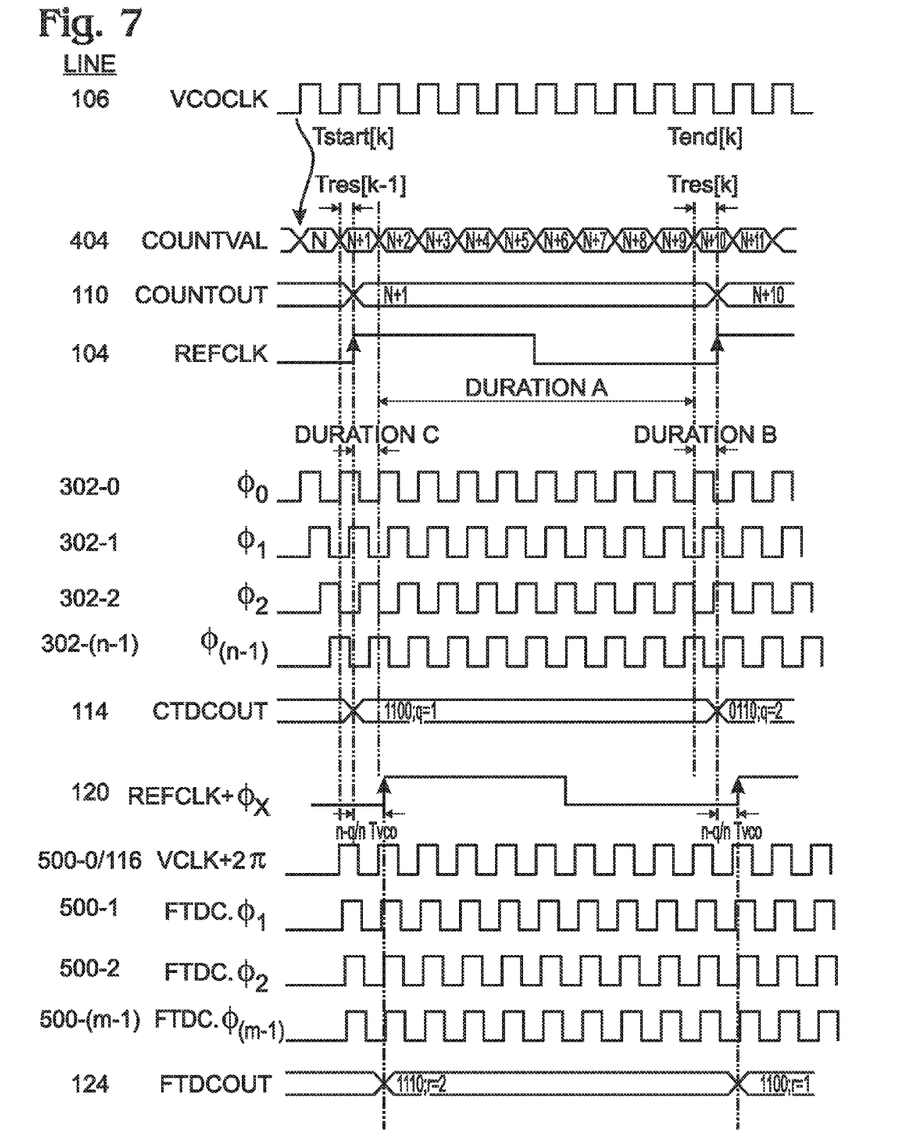
FIG. 7 is a timing diagram illustrating the theory of operation of the STDC of FIG. 6.

FIG. 7 is a timing diagram illustrating the theory of operation of the STDC of FIG. 6. In this example, n=4. The ratio of the period of $T_{vco}$ and $T_{ref}$ can be derived from the combination of the count (HSCNTROUT), the first difference measurement (CTDCOUT), and the third difference measurement (FTDCOUT).

Tref[k] comprises:

Duration A;

Duration B; and,

Duration C.

At the rising edge of the REFCLK, the HSCNTR output COUNTVAL (tally) is sampled by the latch (DFF) to become COUNTOUT (the HSCNTROUT on line 110 of FIG. 6). Duration A can be derived from COUNTOUT with the following equation:

Duration $A$=Tvco×(COUNTOUT[$k$+1]−COUNTOUT[$k$])

CTDC1 outputs a digital word that represents the position of the REFCLK with, respect to the VCOCLK. In the case of n=4, CTDCOUT has one of the four patterns 1001, 1100, 0110, and 0011, which represent q/n Tvco<Tres[k]<(q+1)/n Tvco, with q=0, 1, 2, and 3, where q is associated with duration B. This digital word controls a multiplexer which selects one of the n phases Φ(n−q) of CTDC2 to be sent to the FTDC. In this example, q[k]=2 and q[k−1]=1.

Alternately, CTDCOUT can be represented by the following Table:

| CTDCOUT | q | Φ selected by MUX |
|---|---|---|
| 1001 | 0 | 3 |
| 1100 | 1 | 2 |
| 0110 | 2 | 1 |
| 0011 | 3 | 0 |

The FTDC accepts the VCOCLK delayed by one VCOCLK cycle, and a delayed version of the REFCLK such that the VCOCLK is delayed by (q/n $T_{vco}$) more than the REFCLK. Since the FTDC is using the delayed version of the REFCLK, the rising edge of the original REFCLK can be used to enable the FTDC, so it is enabled only fref/(n*fvco) of the time. In the case of k=4, FTDCOUT has one of the four patterns: 1000, 1100, 1110, and 1111, which represents (q/n)+(r/nm) Tvco<Tres[k]<q/n+(r+1)/((nm)−Tvco), with r=0, 1, 2, and 3.

The variable r is used to calculate another part of duration B. Generally, the term "q" is associated with a time duration at least an order of magnitude larger than the time duration associated with the term "r".

With r[k] and q[k] identified, the following can be derived:

$$\text{DURATION B} = Tvco \times \left( \frac{q[k]}{n} + \frac{r[k]}{n*m} \right)$$

Similarly, $$\text{DURATION C} = Tvco \times \left( 1 - \frac{q[k-1]}{n} + \frac{r[k-1]}{n*m} \right)$$

The ratio between Tref and Tvco is therefore:

$$\frac{Trefclk[k]}{Tvcoclk} = \text{COUNTOUT}[k+1] -$$

$$\text{COUNTOUT}[k] + 1 \left| \frac{q[k] - q[k-1]}{n} \frac{r[k] - r[k-1]}{m} \right|$$

The FTDC, CTDC1, and HSCNTR digital outputs are sent to the DSP, and the DSP outputs a digital word that computes the above equation to obtain the ratio between Tref and Tvco.

Note that in the above example, the delay coverage of FTDC1 is 1/m Tvco. An implementation with FTDC1 delay coverage larger than 1/m Tvco has the advantage of providing redundancy for error checking.

The STDC examples of FIGS. 1 and 6 are enabled with one stage of coarse TDC, but it should be understood that the system is not limited to any particular number of coarse TDCs, and that the use of more TDCs permits finer resolution. The STDC also includes an integrated power management feature, which permits a significant reduction in power consumption by turning off certain blocks (e.g., the CTDCs and FTDC) when they are not being used.

Figure 8:
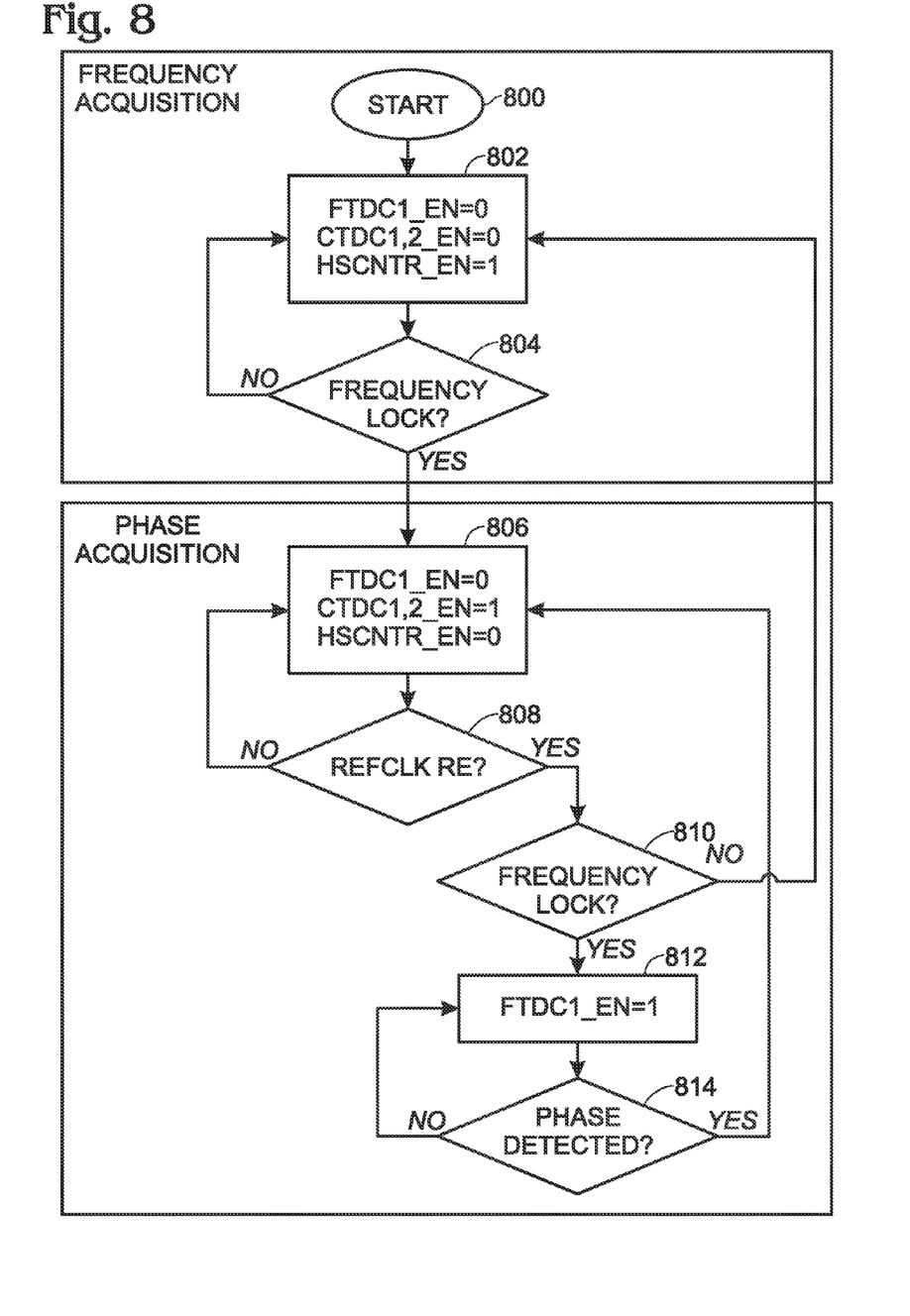
FIG. 8 is a flowchart illustrating a STDC process for phase frequency acquisition.

FIG. 8 is a flowchart illustrating a STDC process for phase frequency acquisition. The STDC starts in frequency acquisition mode (Step 800). In Step 802 the two CTDCs and the FTDC are disabled, and the DSP is monitoring the HSCNTR and the REFCLK inputs. The DSP of the STDC generates a digital signal output that is, proportional to the frequency difference. Step 804 determines if frequency lock is achieved. If frequency lock is achieved, the STDC switches to phase acquisition in Step 806. The two CTDCs are enabled and the HSCNTER is disabled. In Step 808 the system is waiting for a rising edge (RE) of the REFCLK. At rising edge of the REFCLK, the FTDC is enabled in Step 812, and disabled again (Step 806) when phase detection is complete (Step 814). This process ensures that the FTDC processes only on the HSCLK transition at every REFCLK cycle. The STDC stays in phase acquisition mode until lock is lost.

At every rising edge of REFCLK (Step 808), the DSP evaluates if lock is lost. If lock is lost, the STDC switches back to frequency acquisition (Step 802).

Figure 9A:
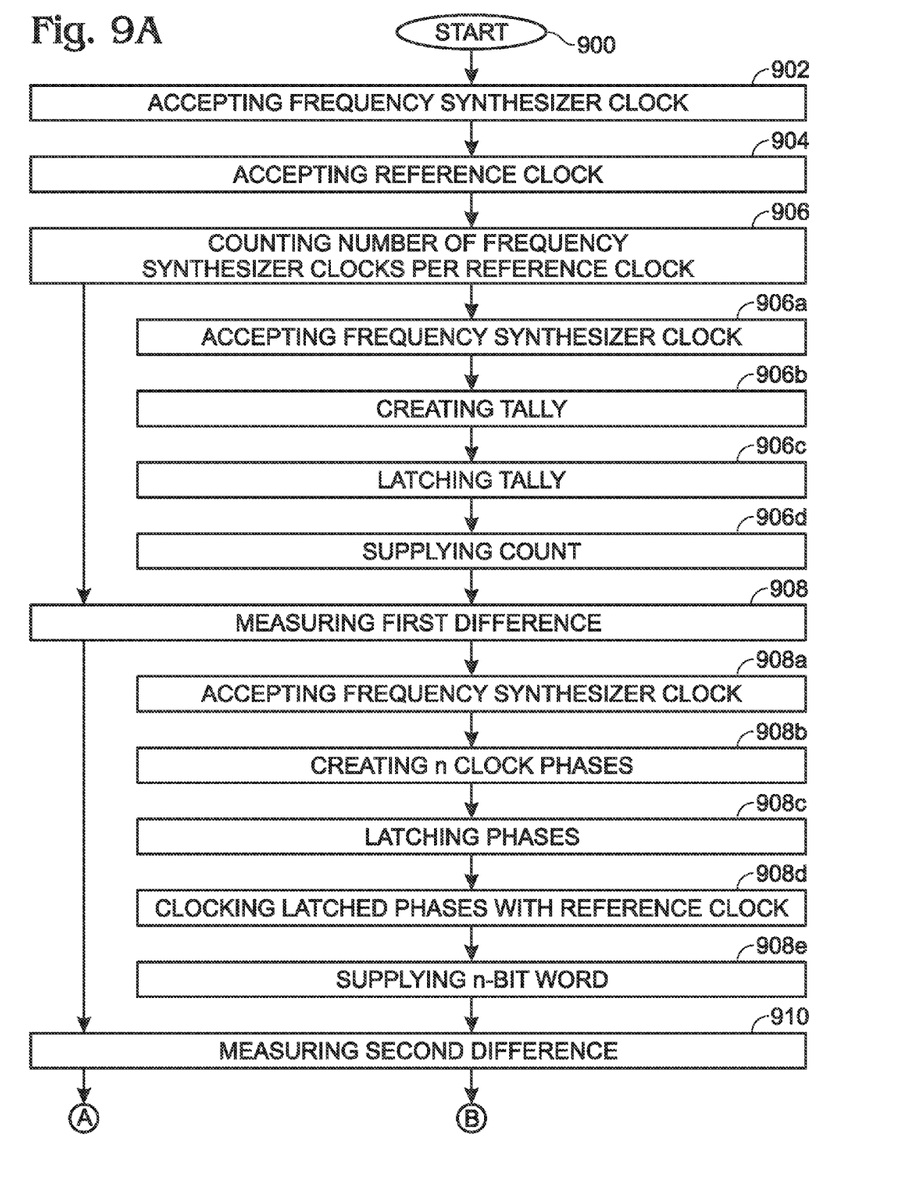
FIG. 9 is a flowchart illustrating a STDC method for supplying a digital word representing the ratio between a phase-locked loop PLL frequency synthesizer signal and a reference clock.
Figure 9B:
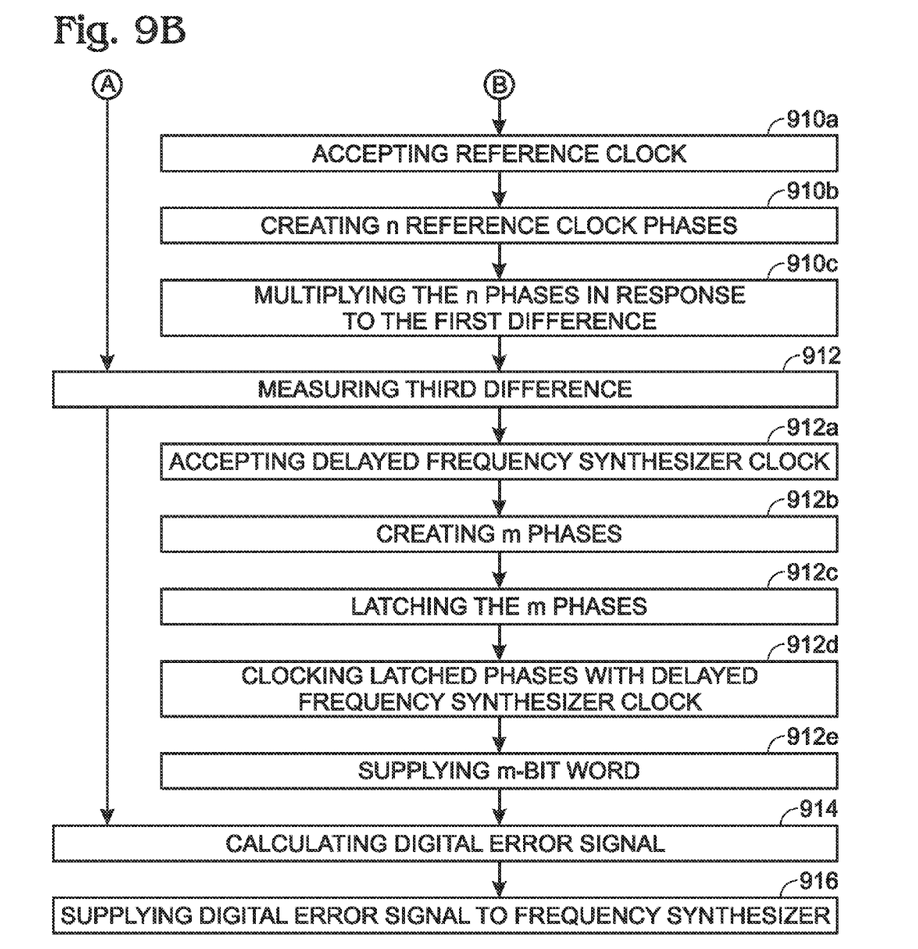

FIG. 9 is a flowchart illustrating a STDC method for supplying a digital word representing the ratio between a phase-locked loop PLL frequency synthesizer signal and a reference clock. Although, the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 900.

Step 902 accepts a frequency synthesizer signal. Step 904 accepts a reference clock. Step 906 counts a number of frequency synthesizer clock cycles per reference clock cycle. Step 908 measures a first difference between an edge of a reference clock period and a corresponding edge of a frequency synthesizer clock period. In response to the first measurement, Step 910 measures a second difference between an edge of a delayed reference clock period and the corresponding edge of the frequency synthesizer clock period, where the second difference is less than the first difference. Step 912 measures a third difference as a time duration between the edge of the delayed reference clock period and the corresponding edge of a frequency synthesizer clock period delayed a full period. Using the third difference measurement, the first difference measurement, and the count of the number of frequency synthesizer clock cycles per reference clock cycle, Step 914 calculates a digital error signal. Step 916 supplies the digital error signal to a frequency synthesizer. The digital error signal may be a frequency error signal, a phase error signal, or both a phase and frequency error signal.

In one aspect, measuring the first difference in Step 908 includes representing the measurement of the first difference as a digital word. More explicitly, measuring the first difference may include the following sub steps. Step 908*a* accepts the frequency synthesizer clock. Step 908*b* creates, n frequency synthesizer clock phases. Step 908*c* latches each frequency synthesizer clock phase. Step 908*d* clocks the latched frequency synthesizer phases with the reference clock, and Step 908*e* supplies an n-bit digital word representing the measurement of the first difference.

In another aspect, measuring the second difference includes the following substeps. Step 910*a* accepts the reference clock. Step 910*b* creates n reference clock phases. Step 910*c* multiplexes the n reference clock phases in response to the measurement of the first difference.

In one aspect, counting the number of frequency synthesizer clock cycles per reference clock cycle includes the following substeps. Step 906*a* accepts the frequency synthesizer clock. In response to an enable signal, Step 906*b* creates a tally of frequency synthesizer clock cycles. Step 906*c* latches the tally, and Step 906*d* clocks the latched tally with the reference clock, to supply the count.

In another aspect, measuring the third difference in Step 912 includes representing the measurement of the third difference as a digital word. More explicitly, measuring the third difference may include the following substeps. Step 912*a* accepts the delayed frequency synthesizer clock. Step 912*b* creates m phases of the delayed frequency synthesizer clock. Step 912*c* latches each phase of the delayed synthesizer clock. Step 912*d* clocks the latched phases of the delayed frequency synthesizer clock with the delayed reference clock, and Step 912*e* supplies an m-bit digital word representing the measurement of the third difference.

In one aspect, measuring the first, second, and third differences includes selectively enabling the measurement of the first, second, and third differences.

A system and method have been provided for using a STDC to create a digital word representing the ratio between a phase-locked loop PLL frequency synthesizer signal and a reference clock. Explicit examples of circuit typologies have been given to illustrate the invention, but the invention is not necessarily limited to just these examples. Other variations and embodiments of the invention will occur to those skilled in the art.

We claim:

1. A successive time-to-digital converter (STDC) comprising:
    a frequency detector having an input to accept a reference clock, input to accept a frequency synthesizer clock from a frequency synthesizer, and an output to supply a count of the number of frequency synthesizer clock cycles per reference clock cycle;
    a first TDC having an input to accept the reference clock, and input to accept the frequency synthesizer clock, the first TDC measuring a first difference between an edge of a reference clock period and a corresponding edge of a frequency synthesizer clock period, providing the first difference measurement at an output, and providing the frequency synthesizer clock delayed a full cycle;
    a phase interpolator having an input to accept the reference clock, an input to accept the frequency synthesizer clock, and an input to accept the first difference measurement, the phase interpolator supplying the reference clock delayed to create a second difference between the edge of the delayed reference clock period and the corresponding edge of the frequency synthesizer clock period, where the second difference is less than the first difference;
    a second TDC having an input to accept the delayed reference clock period, and input to accept the delayed frequency synthesizer clock, the second TDC measuring a third difference between the edge of the delayed reference clock period and the corresponding edge of the delayed frequency synthesizer clock period, and providing the third difference measurement as a time duration; and,
    a digital signal processor (DSP) having an input to accept the third difference measurement, an input to accept the first difference measurement, an input to accept the count from the frequency detector, and an output to supply a digital error signal to the frequency synthesizer.

2. The STDC of claim 1 wherein the DSP supplies a digital error signal to the frequency synthesizer selected from a group consisting of a frequency error signal, a phase error signal, and both a phase and frequency error signal.

3. The STDC of claim 1 wherein the first TDC supplies the first difference measurement as a digital word representing the relationship between the edge of the reference clock and a phase of the frequency synthesizer clock.

4. The STDC of claim 3 wherein the first TDC includes:
n serially connected delay circuits to accept the frequency synthesizer clock, supplying n frequency synthesizer clock phases; and
n latches, each latch having a signal input connected to receive a corresponding frequency synthesizer clock phase, a clock input connected to receive the reference clock, and an output to supply a corresponding bit in an n-bit first difference measurement signal.

5. The STDC of claim 1 wherein the phase interpolator includes:
n serially connected delay circuits to accept the reference clock, supplying n reference clock phases; and,
a multiplexer (MUX) having signal inputs to accept the n reference clock phases and a control input to accept the first difference measurement.

6. The STDC of claim 1 wherein the frequency detector includes:
a counter having an input to accept the frequency synthesizer clock, an input to accept an enable signal from the DSP, and an output to supply a tally triggered by the enable signal; and,
a latch having a signal input to accept the tally, and clock input connected to receive the reference clock, and an output to supply the count of the number of frequency synthesizer clock cycles per reference clock cycle.

7. The STDC of claim 1 wherein the second TDC supplies the third difference measurement as a digital word representing the relationship between the edge of the delayed reference clock and a phase of the delayed frequency synthesizer clock.

8. The STDC of claim 7 wherein the second TDC includes:
m serially connected delay circuits to accept the delayed frequency synthesizer clock, supplying m phases of the delayed frequency synthesizer clock; and,
m latches, each latch having a signal input connected to receive a corresponding phase of the delayed synthesizer clock, a clock input connected to receive the delayed reference clock, and an output to supply a corresponding bit in an m-bit third difference measurement signal.

9. The STDC of claim 8 wherein the second TDC is selectively enabled in response to a signal from the DSP.

10. A successive time-to-digital converter (STDC) method for supplying a digital word representing the ratio between a phase-locked loop PLL frequency synthesizer signal and a reference clock, the method comprising:
accepting a reference clock;
accepting a frequency synthesizer signal;
counting a number of frequency synthesizer clock cycles per reference clock cycle;
measuring a first difference between an edge of a reference clock period and a corresponding edge of a frequency synthesizer clock period;
in response to the first measurement, measuring a second difference between an edge of a delayed reference clock period and the corresponding edge of the frequency synthesizer clock period, where the second difference is less than the first difference;
measuring a third difference as a time duration between the edge of the delayed reference clock period and the corresponding edge of a frequency synthesizer clock period delayed a full period;
using the third difference measurement, the first difference measurement, and the count of the number of frequency synthesizer clock cycles per reference clock cycle, calculating a digital error signal; and,
supplying the digital error signal to a frequency synthesizer.

11. The method of claim 10 wherein supplying the digital error signal includes supplying a signal selected from a group consisting of a frequency error signal, a phase error signal, and both a phase and frequency error signal.

12. The method of claim 10 wherein measuring the first difference includes representing the measurement of the first difference as a digital word.

13. The method of claim 12 wherein measuring the first difference includes:
accepting the frequency synthesizer clock;
creating n frequency synthesizer clock phases;
latching each frequency synthesizer clock phase;
clocking the latched frequency synthesizer phases with the reference clock; and,
supplying an n-bit digital word representing the measurement of the first difference.

14. The method of claim 10 wherein measuring the second difference includes:
accepting the reference clock;
creating n reference clock phases; and,
multiplexing the n reference clock phases in response to the measurement of the first difference.

15. The method of claim 10 wherein counting the number of frequency synthesizer clock cycles per reference clock cycle includes:
accepting the frequency synthesizer clock;
in response to an enable signal, creating a tally of frequency synthesizer clock cycles;
latching the tally; and,
clocking the latched tally with the reference clock, to supply the count.

16. The method of claim 10 wherein measuring the third difference includes representing the measurement of the third difference as a digital word.

17. The method of claim 16 wherein measuring the third difference includes:
accepting the delayed frequency synthesizer clock;
creating m phases of the delayed frequency synthesizer clock;
latching each phase of the delayed synthesizer clock;
clocking the latched phases of the delayed frequency synthesizer clock with the delayed reference clock; and,
supplying an m-bit digital word representing the measurement of the third difference.

18. The method of claim 17 wherein measuring the first, second, and third differences includes selectively enabling the measurement of the first, second, and third differences.

* * * * *